United States Patent [19]

Riesner et al.

[11] Patent Number: 4,698,729
[45] Date of Patent: Oct. 6, 1987

[54] ARRANGEMENT OF COMPONENTS

[75] Inventors: Gerhard Riesner, Nuremberg; Walther Koch, Schwalbach, both of Fed. Rep. of Germany

[73] Assignee: Diehl GmbH & Co., Nuremberg, Fed. Rep. of Germany

[21] Appl. No.: 855,970

[22] Filed: Apr. 23, 1986

[30] Foreign Application Priority Data

Oct. 17, 1985 [DE] Fed. Rep. of Germany ....... 3536963

[51] Int. Cl.$^4$ ............................................. H05K 7/20
[52] U.S. Cl. .................................................. 361/386
[58] Field of Search ............... 361/386, 388, 389, 395, 361/385, 412, 413, 398; 339/112 R

[56] References Cited

U.S. PATENT DOCUMENTS 3,311,790 3/1967 Vizzier, Sr. et al. ................ 361/386
4,509,098 4/1985 Das Gupta et al. ................. 361/398

Primary Examiner—Roy N. Envall, Jr.
Attorney, Agent, or Firm—Scully, Scott, Murphy & Presser

[57] ABSTRACT

A compact assembly or arrangement of components or constructional elements which are constituted of interconnected conductive printed circuit boards with electrical components and with cooling members for the dissipation of the heat from the energy losses of the components, especially for the realization of a complex signal processing circuit in flying bodies or missiles. The cooling members are constituted of relatively large-surfaced flat plates as carriers for printed circuit board modules which are located on at least on one of their side surfaces, and which have one end surface with contacting regions of flexible band conductors press against connecting conductive paths on a wired printed circuit board which is oriented perpendicularly thereto.

10 Claims, 7 Drawing Figures

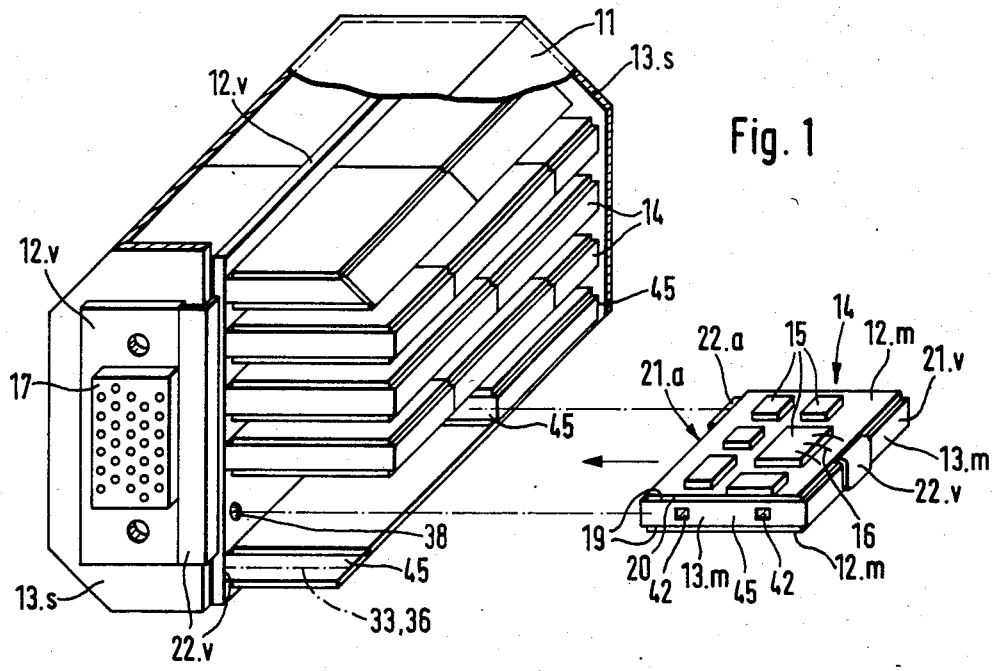

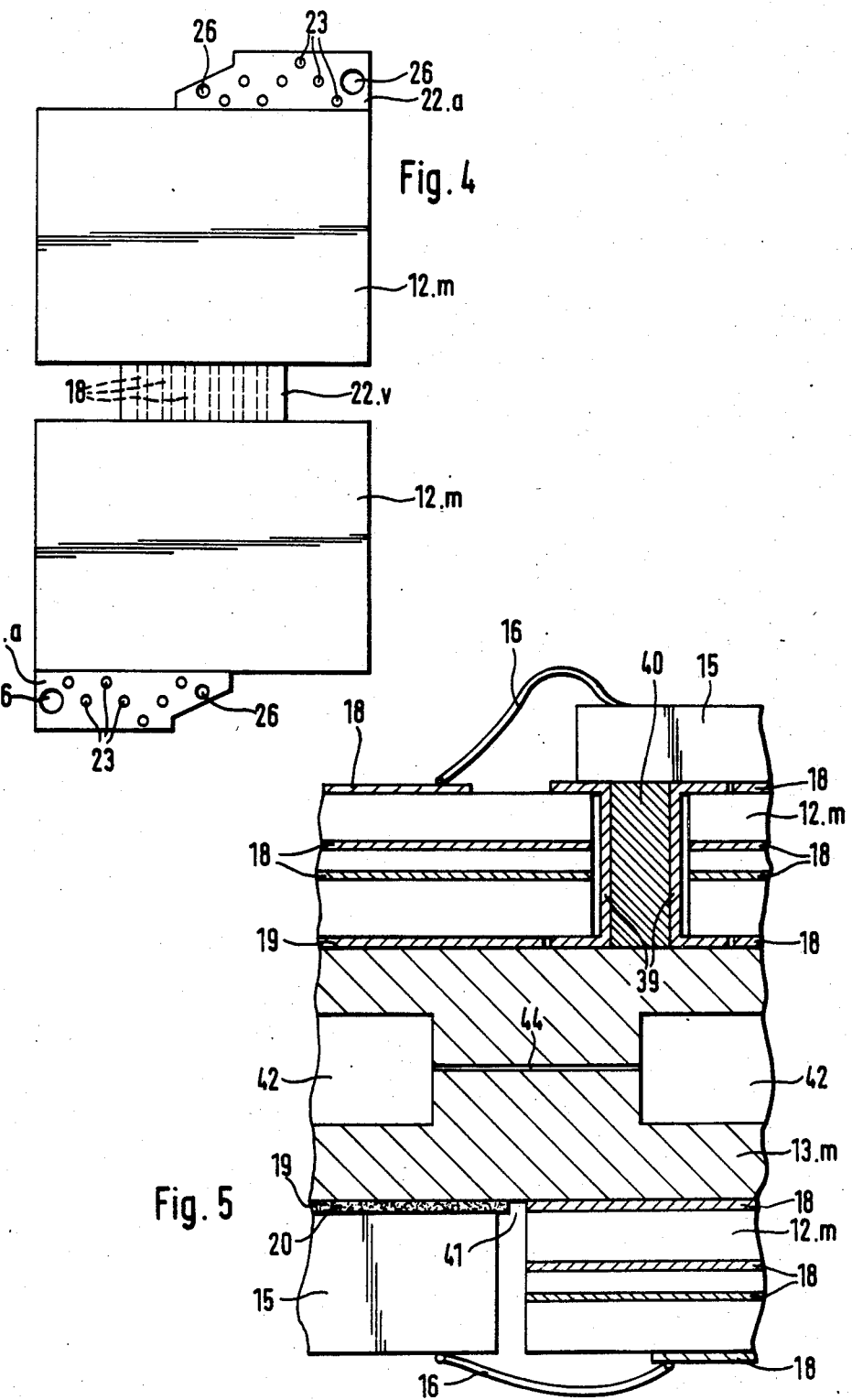

ARRANGEMENT OF COMPONENTS

BACKGROUND OF THE INVENTION

1. Field of the Invention

The present invention relates to a compact assembly or arrangement of components or constructional elements which are constituted of interconnected conductive printed circuit boards with electrical components and with cooling members for the dissipation of the heat from the energy losses of the components, especially for the realization of a complex signal processing circuit in flying bodies or missiles.

2. Discussion of the Prior Art

An arrangement of that type for components is already generally known from the disclosure of German Laid-Open Patent Appln. No. 33 31 112. The arrangement of the surface-profiled cooling members on the printed circuit board which provides the supportive or carrying function, and must accordingly be designed in a particularly stable manner, is in all instances, extremely place-consuming; especially at times when such a printed circuit board is equipped with subassemblies, or itself constitutes the subassembly of a larger unit, and is to be realized within a narrow space.

SUMMARY OF THE INVENTION

In recognition of these conditions, it is an object of the present invention to provide an assembly or arrangement of components or constructional elements of the above-mentioned type, which while affording a sufficient dissipation of energy heat losses at increased demands, can be realized so as to be extremely compact, particularly also with respect to the requirements for electrically and mechanically secure but simply detachable electrical connections of the components among each other; in which there is especially contemplated an arrangement of components for the formation of the signal processing circuits in a subordinate-ammunition flying body or projectile searching for a target, in which projectile there is only available a relatively short axial section for the locating of components which are to contact each other in a shock- and vibration resistant manner which, on the other hand, should be easily exchangeable in conformance with the results of operational tests.

The foregoing object is essentially attained through the invention in that the arrangement of components of the type described has the cooling members constituted of relatively large-surfaced flat plates as carriers for printed circuit board modules which are located on at least on one of their side surfaces, and which have one end surface with contacting regions of flexible band conductors press against connecting conductive paths on a wired printed circuit board which is oriented perpendicularly thereto.

Pursuant to the foregoing arrangement, the cooling member itself affords carrying and contact-maintaining functions, in that it carries printed circuit boards on a large surface, in essence, with at least one side surface, and with an end side provides the contacting pressure through a flexible band or strip conductor; which extends as an electrical contact element from the ohmic contacting location from the side surface in front of the cooling plate to the printed circuit board on the side surface of the cooling member.

Hereby, this band or strip conductor is preferably unitarily constructed with the printed circuit board, in that its conductive paths represent the flexible, insulated extension of the conductive paths which are laminated on the rigid printed circuit board; in which at least the printed circuit board itself is, preferably, realizable in a multilayered, through-contacting lamination, such as is generally known from German Published Patent Appln. No. 28 43 710 for a multilayered flexible printed circuit.

A uniform pressing is obtained for the contacting regions of the band or strip conductor against the oppositely-located contacting areas of the conductor path laminations of a wired printed circuit board, as a result of the pressure force exerted in the longitudinal direction of the cooling plate from its end side, through the interposition of a relatively thin layer of a stiffly-elastic material between the end side and the band conductor; for which purpose a small-porous polyurethane foam is particularly adapted, as has been already marketed for various other types of technological uses by the Elastogran-Group of the company BAS.

In order, on one hand, to be able to protect the surfaces of the conductive paths on the connecting band or strip conductor, and to protect them against environment influences on the connector printed circuit board by means of an electrically-insulating coating but, on the other hand, not to have the contacting regions of the electrically-active connecting surfaces to be placed too high above the plane of the conductor-path laminations through upwardly projecting knubs, but in the interest of simple manufacture, to be able to limit itself with regard to the conductive path laminations to surface-like contacting area expenses, it is expedient to provide an electrical bridge as a connector contact in the form of small stampings of comparatively soft, electrically-conductive contact material, which is impressed into the depressions intermediate the conductor path contacting areas which are arranged in the insulating layers in the neighborhood of the contact surfaces. These bridging stampings, for reasons of handling, are expediently combined in an applicable geometric distribution on a carrier foil or substrate into a unitarily manipulable unit for all contact regions in front of the end face of a cooling plate, which upon the pressing of the end face of the cooling plate against the wired conductor plate (or against another structural component on whose surface there are arranged wired conductor paths), is maintained in a clamped condition between the contact areas on both sides.

This clamping action is effected in an expedient manner by means of tightening screws extending in the plane of the cooling plates, which may be in the form of set screws or screw bolts with locking nuts, which can be screwed into the exposed end side or face of the cooling plate which is located opposite the contact end surface, and which are preferably guided within bores which are directly formed in the central plane of the cooling plate. Without any significant adverse effects on the functioning of the support for the conductor plates, and for the dissipation of the heat of the components, by means of such longitudinal bores there is appreciably reduced the weight of the cooling plates; and there is obtained an extremely stable fastening under a uniform connector contacting pressure with a simple accessibility to these fastening elements.

A cooling plate of that type, with conductor plates fastened thereon, and contacting through transition along a strip or band conductors along the end face of the cooling plate, represents a compact, easily interchangeable, and because of the freely accessible surfaces (on which there are mounted the electrical components), an easily testable circuit module. In the event that conductor plates are arranged on both side surfaces of the cooling plate, the connecting strip or band conductors can then be conducted in a U-shape about the end face of the plate, and can possess conductor paths which, among each other, in addition to the connecting function, also serve for the direct electrical interconnection of the conductor plates on both sides of a module. In the realization of extremely complex circuits within a module; in essence on the conductor plates on both sides thereof, for instance when these are constructed to the known multilayer technology, so many connective conductors can become necessary between both side surfaces, that the bridging or shunting adjacent the contacting regions is inadequate due to reasons of lack of space, or in any event, would not be expedient in the interest of obtaining sufficient spacings. In this case, it is expedient to provide flexible wired strip conductors on the rearward end face of the cooling plate located opposite the connection, between the two side surfaces which are covered with the conductor plates. In order to avoid the need for forming additional connecting contacts, the strip conductor lamination expediently relates to an integral extension of laminated layers in each of the two conductor plates, which hereby connect as stiff areas to the flexible strip or band conductor area. In the interest of obtaining a simple assembling or mounting of the conductor plates on the side surfaces of the cooling plate, at the inner, in effect, at the connecting end face, there is not provided any closed U-shaped strip or band conductor, but respectively projecting from the end face of the conductor plate located herein, mutually offset along the end face, is a strip conductor extension, which with the interposition of the elastic insert, is arranged in an L-shape about the connecting end face.

For the relatively short operating period of a target searching and tracking circuit within a projectile, the design for the cooling capacity of the plates is relatively devoid of any problems. However, operating timespan under the functioning test conditions is lengthier by a multiplicity; thus, during test operation, a considerably larger quantity of heat must be conducted away or dissipated from the connector area of the components on their conductor plates. Consequently, and for the concurrent further reduction in weight of the cooling plates without significantly influencing their mechanical supportive function, it is expedient to traverse the plates with a network of passageways, through which there can be pumped a heat take off fluid during stationary test operation. For the infeed and discharge of this cooling medium there can be selected the face plates of a housing which encompasses the entirety of the arrangement of the components, within which distributor passageways connect to the individual cooling plate modules extending perpendicular thereto; in effect, in the longitudinal direction of the housing for the groups of components. Concurrently, these face plates can also serve as supports or substrates for the connecting paths to the wired conductor plates on which, in turn, there are mechanically and electrically connected the previously described module; with flexible strip conductors for the positioning of these connecting conductor plates on the outside of the face plates of the housing, whereupon there can be mounted the usual socket plugs for peripheral apparatus connectors.

Thus, within the housing it is possible to provide a compact arrangement of components which is optimizable with respect to the mechanical and thermal demands whose individual circuit modules, on the one hand, can be securely contacted but which, on the other hand, is readily exchangeable, without necessitating the utilization of space-consuming ordinary conductor plate-socket plugs.

BRIEF DESCRIPTION OF THE DRAWINGS

Additional alternatives and modifications, as well as further features and advantages of the invention can be readily ascertained from the following detailed description of exemplary embodiments of the invention, taken in conjunction with the generally schematically illustrated drawings; in which:

FIG. 1 illustrates, in a perspective view, a compact arrangement of components with the indication of an enclosure housing, with the drawn-out representation of a conductor plate module;

FIG. 2 illustrates a fragmentary sectional representation of the mechanical and electrical connection of two conductor plate modules to a wired conductor plate;

FIG. 4 illustrates an example of the electrical connection between two conductor plates of a conductor plate module;

FIG. 5 illustrates the equipping capability of a conductor plate module with consideration given to the heat take off conditions;

DETAILED DESCRIPTION

Figure 6:
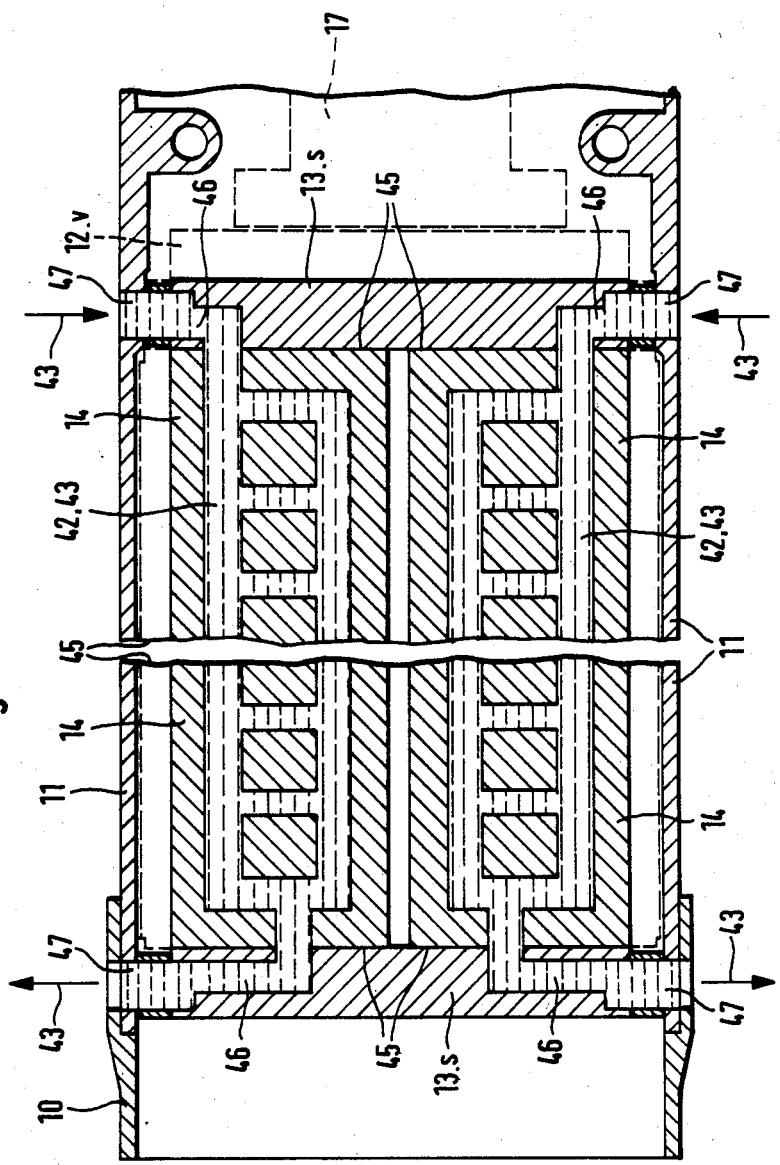
FIG. 6 illustrates a housing equipped with modules according to FIG. 1, in a broken representation in an axial longitudinal section.
Figure 7:
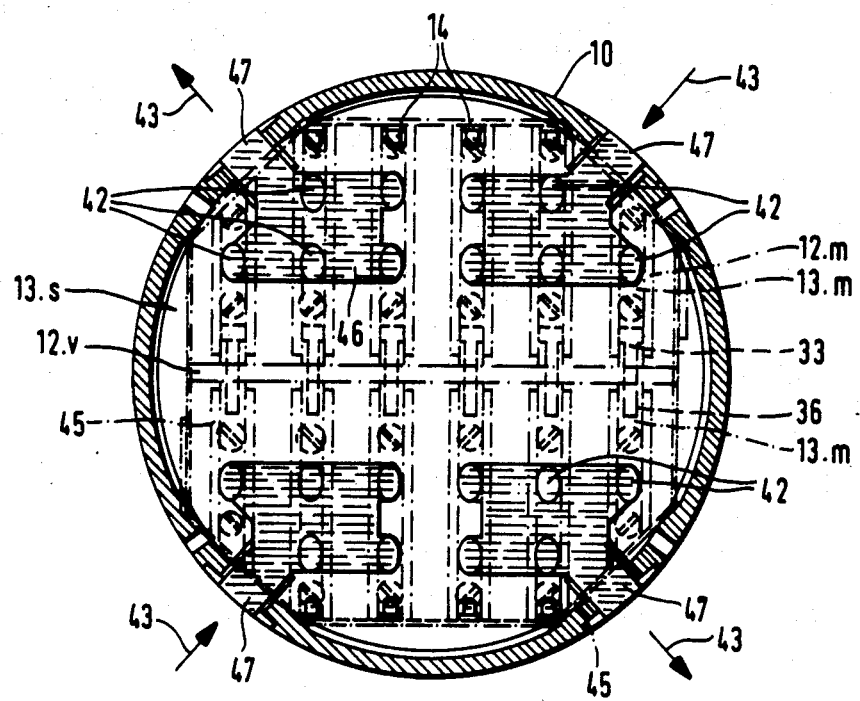
FIG. 7 illustrates a housing end plate according to FIG. 6, shown in a longitudinal section.

The compact arrangement of components illustrated in FIG. 1 is, for example, the entire signal processing electronic system for the target searching and tracking arrangement of a subordinate-ammunition flying body or missile, and assembled into the narrowest space within an axial section of the structure or fuselage of the flying body. In correlation with the assembly conditions of this structure 10 (FIG. 6), the functionally-active housing 11 surrounding the component arrangement, which can be tested with regard to its functioning externally of the projectile, is approximately cylindrically shaped, as can be ascertained from the fragmentary representation in FIG. 1. The component arrangement within this housing 11 encompasses a large number of conductor plates 12, which are combined into groups, primarily in paired arrangement on both sides of cooling plates 13.m into conductor plates modules 14. These plates 13.m, serve for the dissipation or take off of heat losses from the electrical components 15, which in a known manner, with electrical contacting, are mechanically fastened (for example, through soldering or adhesives) away from plates 13.m. With regard to the components 15, this can pertain to discrete electrical components; however, preferably to complex electronic circuitry in the integrated or hybrid circuit technology, which are connected through bonding wires 16 to the conductor paths 18 (FIG. 5) of the module conductor plates 12.m.

Serving as the carrier or support for the conductor plates 12, in addition to the cooling plates 13.m of the module, can also be structural components of the housing 11; such as the end or face plates 13.s thereof; in which the conductor plates 12 will then preferably not carry any electronic components, but serve as wired conductor plates 12.v for the interconnection of the modules 14 with respect to each other or for the electrical connection of socket plug connectors 17 to apparatus located outside of the housing 11. On the other hand, areas of the module conductor plates 12.m can serve as wired conductor plates for sub-modules which are fastened thereon (not shown in the drawings).

The module-conductor plates 12.m are configured in the multi-wire technology, or preferably in the multi-layer technology; in effect, provided with conductor paths 18 which are insulated with respect to each other and which extend in a plurality of parallel planes, as is shown in the primary representation of FIG. 2 for two outer planes and one intermediate plane. The conductor plates 12.m lie flat on the side surfaces 19 of the essentially planar plates 13.m; and when necessary, with the interposition of a thermally best possible conductive adhesive layer 20, such as an insulating lacquer. The wired conductor plates 12.v can be similarly mounted in a corresponding manner on the plates 13; or the wired conductor plates 12.v, with the omission of any plate asserting a separate support function, can be constructed more stably, as is considered in FIG. 2 through the heavier thickness.

Figure 3:
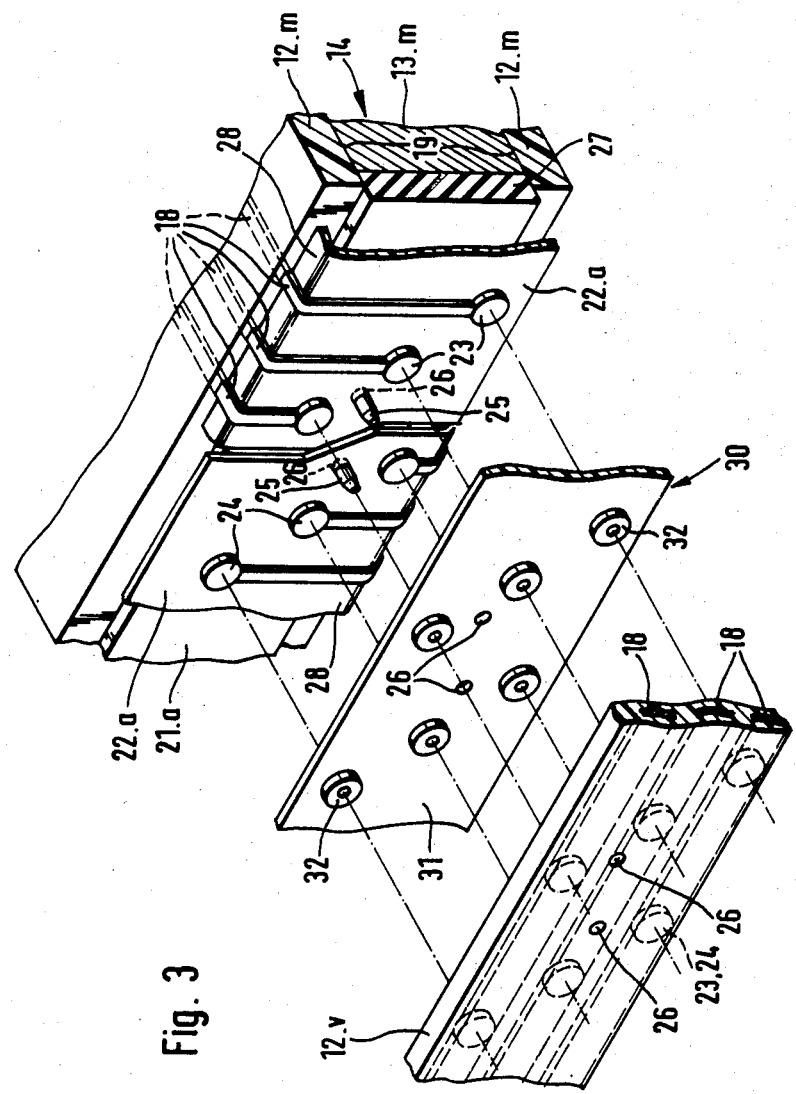
FIG. 3 illustrates, in an enlarged perspective exploded view, the representation of a connector area between a conductor plate module and a wired conductor plate.

The electrical and mechanical connection between the conductor plates 12.m of the module, and the wired conductor plates 12.v is effected, by means of the cooling plates 13.m of the module, along an end face 21.a; in the interest of obtaining a more compact construction notwithstanding high contact security for a simply exchangeable modules 14; however, not through the use of socket plug connectors, but rather by means of flexible strip or band conductor 22.a which are connected to the conductor paths 18 of at least one plane, which are pressed at the contact areas 23 against associated conductor paths 18 on the facing surface of the wired conductor plate 12.v (as shown in FIG. 3).

The flexible strip conductors 22.a are expediently formed integrally with the conductor path laminations of at least in one of the interior planes of the multi-layered conductor plates 12.m. Thus, they egress (as shown through a simplified representation in FIGS. 2 and 3) at the end surface from the interior of the conductor plates 12.m, so as to be bent in front of the end face 21.a of the plate 12.m, wherein the conductor paths 18 are exposed to the contacting areas 23, including, when required, somewhat protruding knub-shaped curvatures (not shown), and provided with contact surfaces 24 which are enlarged relative to the width of the conductor paths 18.

When in the interest of obtaining a dense packing, as is illustrated in the drawing, both side surfaces 19 of a plate 13.m are supplied with conductor plates 12.m, then is expedient that electrical connections, which are to be formed within a module 14 between these two conductor plates 12—12, are not drawn additionally besides the contacting areas 23 over the connecting end face 21.a, but for this purpose through the use of additional strip or band conductors 22.v there is undertaken a bridging over or shunting at the oppositely located end face 21.v, as shown in FIG. 1, and as is illustrated in FIG. 4 by a development of both conductor plates 12.m into a representative plane. In the interest of obtaining a more simple manufacture, and equipping in this plane, a through-extending connecting strip conductor 22.a is not provided on the inwardly located end face 21.a between the two conductor plates 12.m; but the strip conductor 22.a is divided into two regions located adjacent each other in the connecting position (FIG. 3), of which each one is connected to one of the two conductor plates 12.m. In order to provide for the exact positioning of the strip conductors 22.a; in effect, the contacting areas 23 thereof relative to each other and in front of the connecting end face 21.a of the module plate 13.m, guide pins 25 are inserted into the end face 21.a and which project in the contacting direction, and which, during the positioning of the strip conductors 22.a about the connecting end face 21.a, engage through adjusting apertures 26 formed in the strip conductors 22.a (as shown in FIG. 3).

The contacting areas 23, or in essence the contacting surfaces 24 of the connecting strip conductors 22.a are pressed against the corresponding areas or surfaces 23, 24 of the wired conductor plate 12.b, which is effected from the plate end face 21.a by means of an elastic insert 27 which is located between the end face 21.a and the strip conductors 22.a which extend sideways thereof from the conductor plates 12.m and which are bent in front of the end surface. During the pressing of the module 14 against the wired conductor plate 12.v, the insert 27 is imparted a certain amount of compression and, as a result, the strip conductor 22.a is subjected to a slight curvature 28 in proximity to its fastening to its conductor plate 12.m; which advantageously leads to a resilient pick-up of vibrations and thereby the avoidance of critical alternating loads in the transitional region to the conductor plate 12.m, and concurrently assures a uniform pressure against all contacting areas 23.

In order to provide protection, for example, against corrosive environmental influences and electrical short-circuits, it is expedient that the surfaces of the conductive paths 18 on the flexible strip conductors 22 be covered by an insulating layer or coating 29 (as shown in FIG. 2; in FIG. 3 not shown for purposes of clarity), which is only cut out or exposed at the locales provided for the application of the contacting areas 23 or connecting surfaces 24 on the conductor paths 18. The foregoing is also applicable to the exteriorly-located conductor paths 18 of the wired conductor plate 12.v. In order to avoid the applying or forming of excessively high knub-like or rivet-like protruding connector surfaces 24 on the connector ends of the strip conductors 22.a and on the conductor paths 18 of the wired conductor plate 12.v, it is expedient to introduce a shunt 30 into the respective connector area. This is preferably integrally formed for all contacting areas 23 which are located on one connecting end face 21.a; for example, in the form of a foil 31, with a pattern conforming to the geometric distribution of the contacting areas 23, by means of through-contacting or through-riveted bridging heads 32. Expediently, it is also possible cut adjusting apertures 26 into the foil 31, so as to ensure the alternating contacting orientation through the bridging 30 into the applicable apertures 26 in the wired conductor plate 12.v by means of the guide pins 25. For the retention of a module 14 at the end face in this contacting position perpendicular to the surface of a wired conductor plate 12.v, under a deforming pressure against the elastic insert 27, at least one tightening or clamping screw 33 is provided for each module 14. This screw can engage by means of a nut or with a head 13 behind a flange in an extension of the connector end face 21.a (not shown in the drawings), or lie against the bottom area 35 of a blind bore 36, which extends in parallel with the plate side surfaces 19 from the rearward end face 21.v (see FIG. 1) in a direction towards the connector end face 21.a, as can be ascertained from the upper portion of FIG. 2. The clamping screws 33 can engage into threaded sleeves which; for example, are inserted into the wired conductor plate 12.v. It may be more expedient, for reasons of stability, when the screws 33 extend through the conductor plate 12.v, and are threaded into an abutment 37 located behind thereof. This abutment 37 can relate to a part of a support structure for the housing 11. In the event that modules 14 are located opposite each other in contact with the oppositely located surfaces of a wired conductor plate 12.v, then the abutment 37 may be suitably provided by a threaded bore 38 in the module plate 13.m which is located opposite the blind bore 36, as is illustrated in the lower portion of FIG. 2. As a consequence, in the surroundings of the contacting areas 23 of the wired conductor plate 12.v, there is provided an unbraced, uniform pressure from both sides thereof. Hereby, the position of the bores 36, 38 is expediently so selected, that the tightening or clamping screws 33 pass through further adjusting apertures 26 in the edge regions of the connecting strip conductor 22a (referring to FIG. 4) in order to also securely fasten the flexible strip conductors 22.a in the edge region of the elastic inserts 27. This module design and grouping also provides the most satisfactory as well as the shortest wiring, by means of the wired conductor plate 12.v in the central longitudinal plane of the housing 11, and the strip conductor wiring about the end faces 21 of the module 14.

For the dissipation or take off of the heat losses from the components 15, there expediently serve the through-contacts 39 (FIG. 5), generally known in use in multi-layer conductor plates 12, which in cross section are of hollow rivet-like configuration, which lie on one side against the module cooling plate 13.m and on whose collar on the surface thereof, the components 15 are mounted to provide good thermal contact.

For the further improvement of the heat transfer to the cooling plate 13.m, the hollow-cylindrical internal space of the through-contacts 39 can be filled with a heat-conductive mass 40, or rivet-like solid pins can be pressed into the cooling plates 13.m, on the heads of which there are mounted the components 15. However, for components 15 which necessitate greater dissipation of heat losses, it is more expedient to provide a cutout 41 extending through the conductor plate 12.m, within which the component 15; with the optional interposition of a thermally-conductive insulating layer 20, is directly mounted on a side or end surface 19 of the module cooling plate 13.m. For the electrical connection to the conductor paths 18 which are on the outer surfaces, in both instances there can be provided bond wires 16; the hollow rivet-like through-contacting to the interiorly located conductor paths 18 which is common in the multi-layered conductor plate technology is not shown in detail in the drawings.

For the relatively short operating period of projectiles, and the correspondingly limited duration in the function of the electronic circuit which is arranged within the housing 11, at a conformed dimensioning of the heat sinks, the heat dissipation is adequate from the components 15 through the mechanically interconnected cooling plates 13, which is described in conjunction with FIG. 5. However, substantially lengthier are the operating periods of the circuit during the course of the functional testing after manufacture. In order to not have to dimension the volume of the heat sinks in the shape of the plates 13, and correspondingly not to need dimensioning of the dimensions of the housing 11 in conformance with these stationary test conditions, for such stationary test operation there is provided an increase in the heat take off or dissipation through the introduction of a cooling medium 43, which flows as a fluid through cooling passageways 42 in the module plates 13.m in parallel with their side surfaces 19. In the event that the cooling plates 13m relate to lightweight metal-injection molded members, the cooling passageways 21 can be concurrently formed within these plates. In other instances, it may be more expedient to mill or grind the passageways 42 into a surface 19, and to close it off by means of an adhesively attached or riveted thereon cover plate. However, it is most satisfactory from a thermal and mechanical standpoint, to divide a cooling plate 13 along the central longitudinal plane, and to mill or machine half of the cross-section of a cooling passageway 42 into, respectively, both of the sides of the thereby formed surfaces of the separating joint 44, before the two half-plates are again assembled along the joint 44 into the module cooling plate 13.m.

The passageways 42 open towards the side surfaces 45 of the plate extending between the end faces 21 (FIG. 1) and at that location, because the close blunt abutting, continue into the adjoining module 14 present in this plane. Finally, the passageways exit into the end plates 13.s, through which, for example, the housing 11 is built into the structure 10 of a projectile. Worked into these end plates 13s are distributing passageways 46 for the connection to the individual module cooling passageways 42, with supply connections 47 in the structure 10. During stationary test operation, the closures at the supply connections 47 are thus exchanged with respect to an infeed and discharge system for the cooling medium 43, the latter of which is introduced through the distributing passageways 46 into the module cooling passageways 42, and during the lengthy occurring stationary test phases serves for the dissipation or take off of the heat losses from the components 15.

What we claim is:

1. In a compact arrangement of structural components including interconnected conductor plates with electrical components and with cooling plates being large-surfaced flat plates constituting carriers for conductor plate modules arranged on at least one of the side surfaces thereof; and having one end surface with contacting areas of flexible strip conductors pressing against contacting conductor paths on a wired conductor plate oriented perpendicularly thereto, said cooling plates for the dissipation of heat losses generated by the electrical components, particularly in the formation of a complex signal processing circuit in flying bodies or projectiles; the improvement comprising in that along said contacting end surfaces, contacting areas of said flexible strip conductors to the conductor plate modules are pressed by clamping screws engaging through the contact end face into the plane of the wired conductor plate, and said clamping screws engage in the same plane of the conductor plate on the module located opposite that side of the wired conductor plate.

2. An arrangement of components as claimed in claim 1, comprising multi-layer laminated conductor plates, at least one laminated plane having a flexible strip conductor extending therefrom in front of the end face of the plate.

3. An arrangement of components as claimed in claim 1, comprising an elastic insert being positioned intermediate the end face of the plate and the strip conductor.

4. An arrangement of components as claimed in claim 1, comprising a contact shunt being arranged intermediate, respectively, the contacting areas of the connector strip conductor of said module and the wired conductor paths.

5. An arrangement of components as claimed in claim 4, wherein said shunt comprises a supporting foil having protruding punchings therein.

6. An arrangement of components as claimed in claim 1, wherein the plates of the modules are traversed by passageways for a cooling medium.

7. An arrangement of components as claimed in claim 6, wherein the passageways discharge towards the side surfaces which are located perpendicular of the end faces of said plates.

8. An arrangement of components as claimed in claim 7, wherein said arrangement is located between the end plates of a housing, distributor passageways for said cooling medium being formed in said end plates and communicating with the cooling passageways in said modules oriented perpendicularly thereof.

9. An arrangement of components as claimed in claim 1, wherein conductor plates arranged on both planar side surfaces of a module cooling plate are connected to each other, opposite the contacting end surface, by wired flexible strip conductors.

10. An arrangement of components as claimed in claim 9, wherein a plurality of rearwardly wired flexible strip conductors are provided on a module, and which project mutually offset from conductor plates.

* * * * *